(12) United States Patent
Maloney et al.

(10) Patent No.: US 7,239,165 B2
(45) Date of Patent: Jul. 3, 2007

(54) PULSE TRANSPORT APPARATUS, SYSTEMS, AND METHODS

(75) Inventors: Timothy J. Maloney, Palo Alto, CA (US); Steven S. Poon, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/096,252

(22) Filed: Mar. 31, 2005

(65) Prior Publication Data

US 2006/0220762 A1    Oct. 5, 2006

(51) Int. Cl.
*G01R 31/26* (2006.01)
*G01R 27/26* (2006.01)
*G01R 31/302* (2006.01)
*H01P 5/12* (2006.01)
*H03H 7/38* (2006.01)

(52) U.S. Cl. .................. 324/765; 324/678; 324/750; 333/109; 333/32

(58) Field of Classification Search .......... 333/109
See application file for complete search history.

(56) References Cited

U.S. PATENT DOCUMENTS

| | | | | | |
|---|---|---|---|---|---|
| 3,710,282 | A | * | 1/1973 | Seinecke | 333/130 |
| 4,081,768 | A | * | 3/1978 | Voss et al. | 333/127 |
| 4,618,838 | A | * | 10/1986 | Kajiwara et al. | 333/33 |
| 5,081,432 | A | * | 1/1992 | Devlin et al. | 332/103 |
| 5,519,327 | A | | 5/1996 | Consiglio | |
| 5,568,105 | A | * | 10/1996 | O'Leary et al. | 333/81 R |
| 5,638,402 | A | * | 6/1997 | Osaka et al. | 375/257 |
| 5,804,977 | A | | 9/1998 | Consiglio | |
| 6,054,907 | A | * | 4/2000 | Sjogren | 333/161 |
| 6,169,410 | B1 | * | 1/2001 | Grace et al. | 324/754 |
| 6,924,651 | B2 | * | 8/2005 | Osaka et al. | 324/628 |
| 2004/0264081 | A1 | | 12/2004 | Maloney | |

OTHER PUBLICATIONS

"HUM2020 Pin Diode", http://www.microsemi.com/datasheets/MSC0874.PDF, (2000), 1-5.
"Picosecond Pulse Labs: Models 5208, 5210, 5212A, 5214 Impulse Forming Networks", http://www.picosecond.com/products/category.asp?pd_id=16, (Jun. 23, 2003), 6 pages.
Cohn, S G., "The re-entrant cross section and wide-band 3-db hybrid couplers", *IEEE Trans. Microwave Theory and Techniques*, vol. MTT-11, (Jul. 1963),254-258.

(Continued)

*Primary Examiner*—Andrew H. Hirshfeld
*Assistant Examiner*—Jeff Natalini
(74) *Attorney, Agent, or Firm*—Schwegman, Lundberg, Woessner & Kluth, P.A.

(57) ABSTRACT

Apparatus and systems, as well as methods and articles, may operate to transmit an initial pulse to a directional coupler, where the initial pulse has an initial amplitude and a timed overshoot of a selected duration. Further activities may include stepping down the initial amplitude to an amplitude approximately equal to the initial amplitude times a mode reflection coefficient squared. A tuning stub may be coupled to a charge line to transmit the initial pulse, and decoupled from the charge line to refrain from receiving an echo pulse associated with the initial pulse.

23 Claims, 4 Drawing Sheets

OTHER PUBLICATIONS

ESD Association, "Transmission Line Pulsing", *ESDA Standards WG 5.5 Draft*, (2003), 1-14.

Gieser, H, et al., "Very fast transmission line pulsing of integrated structures and the charged device model", *IEEE Transactions on Components, Packaging, and Manufacturing Technology, Part C*, 21(4), (Oct. 1998), 278-285.

Maloney, T, et al., "Transmission Line Pulsing Technique for Circuit Modeling", *1985 EOS/ESD Symposium Proceedings*, (1985), 49-54.

Matthaei, George L., et al., "Microwave filters, impedance-matching networks, and coupling structures", New York, *McGraw-Hill*, (1964), 778-779.

"Eagleware PN 13—Electrical to Physical with Advanced TLINE—Product Note", *Eagleware*, Norcross, GA 30071, http://www.eaglesware.com/pdf/apps/0013_AdvancedTLINE.pdf, 1-7, copyright 2002.

"Power dividers and directional couplers", http://en.wikipedia.org/wiki/Directional_coupler, 1-9.

Henry, Leo, et al., "Transmission-Line Pulse ESD Testing of ICs: A New Beginning", http://www.ce-mag.com/ce-mag.com/archive/01/03/0103CE_046.html, 1-12.

Maloney, Timothy, et al., "Using Coupled Lines to Produce Highly Efficient Square Pulses for VF-TLP", *28th Electrical Overstress/Electrostatic Discharge Symposium*, Tucson, AZ, Sep. 7-15, 2006, 1-7.

Maloney, Timothy, et al., "Using Coupled Transmission Lines to Generate Impedance-Matched Pulses Resembling Charged Device Model ESD", *26th Electrical Overstress/Electrostatic Discharge Symposium*, Dallas, TX Sep. 19-23, 2004, 1-8.

Schauwecker, Bernd, et al., "RF-MEMS Components for Broadband Applications", http://www.empire.de/main/Empire/pdf/publications/2003/ws-s_sirf2003.pdf, (Apr. 2003), 1-4.

Simon, W., et al., "EM Design of an Isolated Coplanar RF Cross for MEMS Switch Matrix Applications", 1-4.

\* cited by examiner

PULSE TRANSPORT APPARATUS, SYSTEMS, AND METHODS

RELATED APPLICATIONS

This disclosure is related to pending U.S. patent application Ser. No. 10/608,469, titled "Pulse Coupling Apparatus, Systems, and Methods", filed on Jun. 26, 2003, assigned to the assignee of the embodiments disclosed herein, Intel Corporation, and incorporated herein by reference in its entirety.

TECHNICAL FIELD

The subject matter disclosed relates generally to apparatus, systems, and methods used to transport pulsed electrical energy from one location to another, including conductors, couplers, switches, and filters.

BACKGROUND INFORMATION

Transmission line pulse (TLP) testing methods have been developed to test circuitry using simulated electrostatic discharge (ESD) pulses under the charged device model (CDM). Thus, high current pulses may be generated by charging a transmission line, and subsequently taking advantage of the impedance and high breakdown voltage of the line to generate a relatively high voltage discharge pulse for a short time. A polarized matching load or an attenuator may be used to terminate the line, and a directional coupler may be used to transport the pulse to the device under test.

When especially short pulses are anticipated (e.g., less than about 5 nanoseconds), it may be useful to select an attenuator rated at about −6 db to −10 db so that echo pulses returned to the testing apparatus from an unmatched device under test, as well as the open end of the charged line, are significantly reduced (e.g., by about 12 to 20 db, respectively) from the amplitude of the discharge pulse. However, using an attenuator in this fashion may also reduce the magnitude of the discharge pulse itself, perhaps to such an extent that the value of the test is compromised.

DETAILED DESCRIPTION

Figure 1:
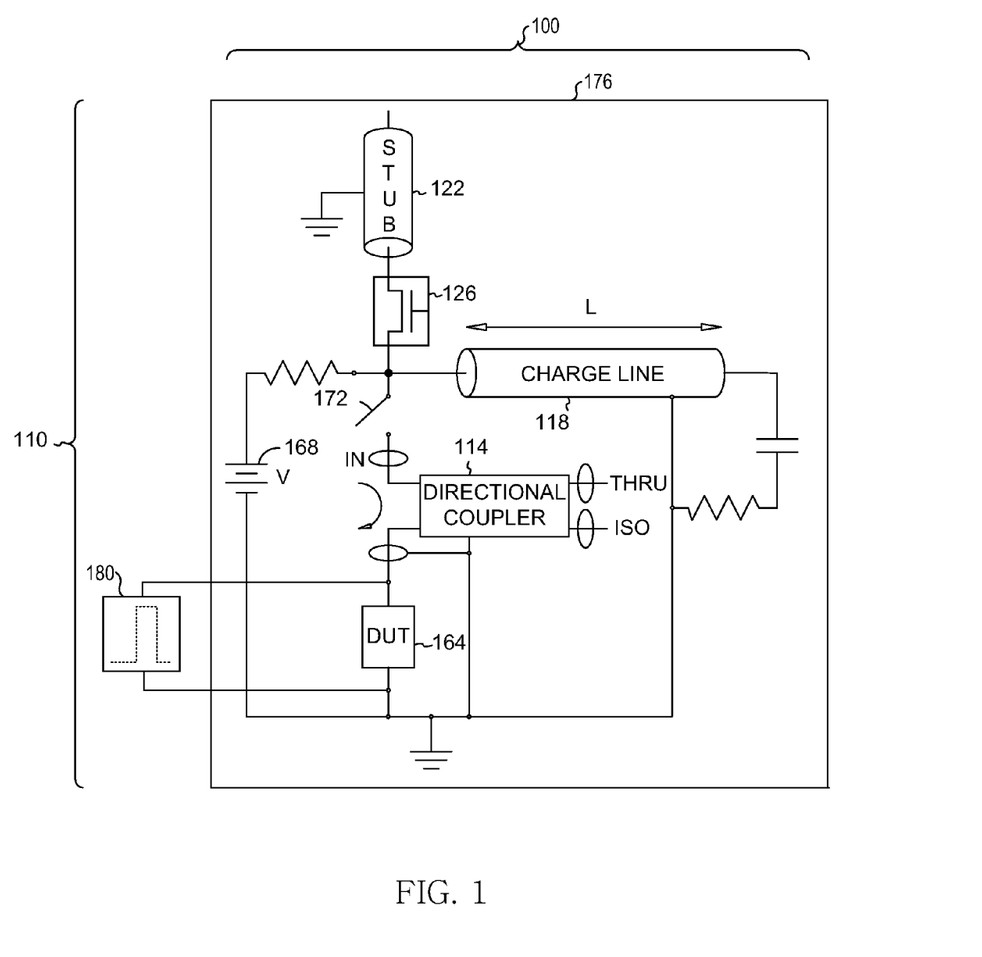
FIG. 1 is a block diagram of apparatus and systems according to various embodiments of the invention.

FIG. 1 is a block diagram of apparatus 100 and systems 110 according to various embodiments of the invention. The challenge of delivering a high-voltage test pulse while reducing the amplitude of subsequent echo pulses may be met by forming a pulse with increased amplitude, employing a timed overshoot, and selectively connecting a tuning stub 122 to the directional coupler 114 being used in conjunction with the device under test 164. By dispensing with an attenuator, the test pulse voltage into the device under test 164 may be increased by up to 15%, and more. In addition, undesired echo pulses produced by an unmatched load (e.g., the device under test 164), may be dramatically reduced. For example, if an active high-voltage MOSFET (metal oxide semiconductor field effect transistor) is used as a switch and matching element 126, adding resistance to the stub 122, the undesired echo pulse may nearly vanish, so as to permit the use of even greater pulse amplitudes in conjunction with the device under test 164 (e.g., perhaps increasing the pulse amplitude out of the coupler by 50%).

Thus, in some embodiments, the apparatus 100 may include a directional coupler 114, a charge line 118 to couple to the directional coupler 114, a tuning stub 122 (e.g., an open-ended stub is shown in FIG. 1), and a matching component 126 to couple the tuning stub 122 to the charge line 118. The directional coupler 114 may be similar to or identical to those available from RLC Electronics of Mt. Kisco, N.Y., such as a 2.4 db (coupling factor k=0.759, 3 db or better over an octave) hybrid stripline coupler tolerating pulses of at least about 3.5 kV, such as a model RLC H-1036"3 db" coupler having an $f_0$=750 MHz.

Figure 2A:
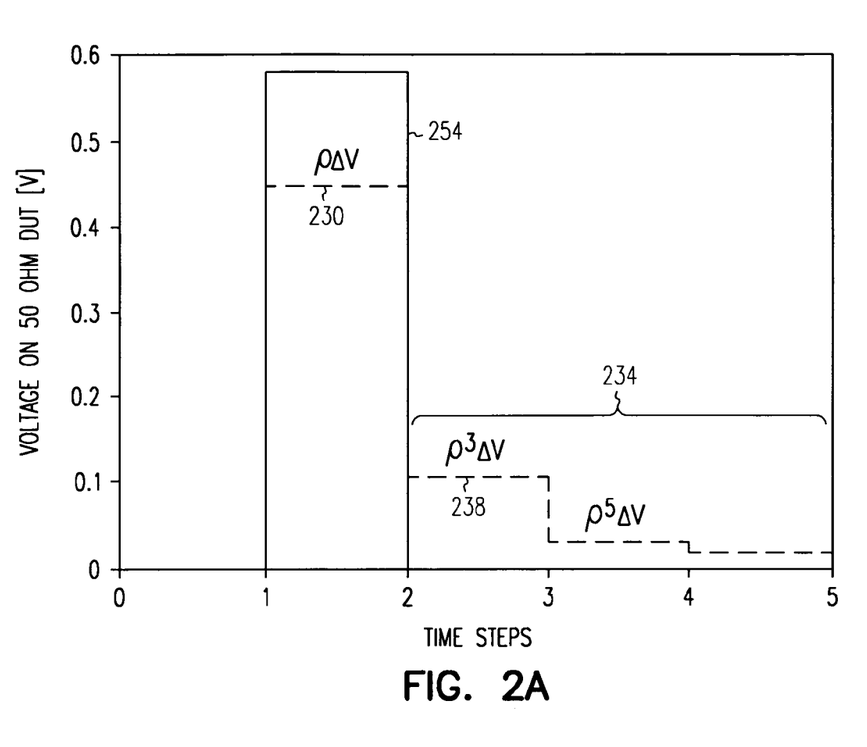
FIGS. 2A and 2B illustrate step function pulses associated with a directional coupler according to various embodiments of the invention.
Figure 2B:
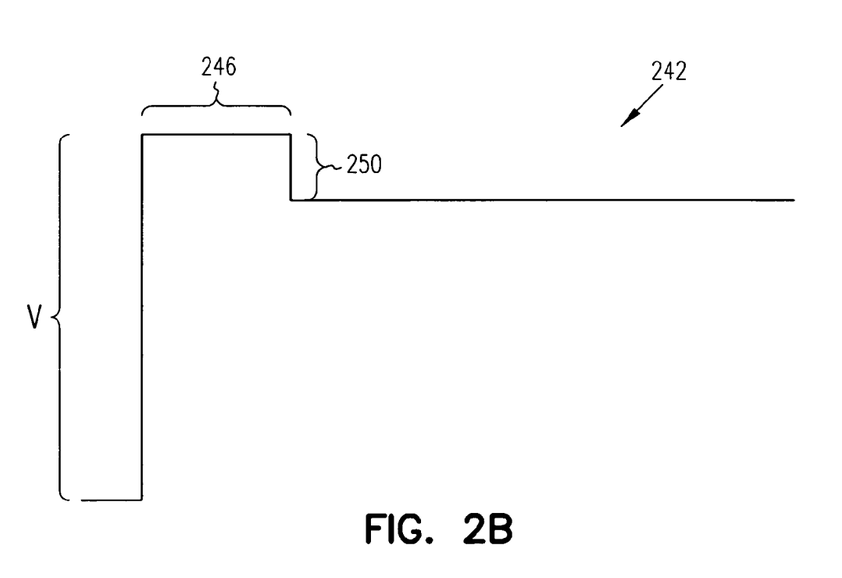

FIGS. 2A and 2B illustrate step function pulses associated with a directional coupler according to various embodiments of the invention. Experimentation has determined that strong couplers do not usually produce square pulses at the output when a step function is present at the input. For example, referring to FIG. 2A, a step function response 230 of a 2.4 db coupler (k=0.759 and mode reflection coefficient $\rho$=0.459 or −6.76 db) can be seen. Here, providing a step function voltage V into an impedance-matched coupler has produced at the output a series of steps of declining strength. The tail 234 pulse series may be expressed as a series of odd powers of $\rho$ (e.g., steps $\rho\Delta V$, $\rho^3\Delta V$, and $\rho^5\Delta V$) with the tail 234 amplitude increasing as the coupling becomes stronger. This is because the coupling at mid-band k relates to the square mode reflection coefficient $\rho$ according to $$\rho = \frac{k}{1 + \sqrt{1-k^2}},$$

wherein k comprises a ratio of a difference of even and odd mode impedances to a sum of the even and odd mode impedances in the charge line 118, or $$k = \frac{Z_{oe} - Z_{oo}}{Z_{oe} + Z_{oo}}.$$

For more information regarding the relationship between the mode reflection coefficient $\rho$, the coupling factor k, and the even/odd mode impedances $Z_{oe}$, $Z_{oo}$, please refer to *Using Coupled Transmission Lines to Generate Impedance-Matched Pulses Resembling Charged Device Model ESD*, by Timothy J. Maloney and Steven S. Poon, 26th Electrical Overstress/Electrostatic Discharge Symposium, Dallas, Tex., Sep. 19–23, 2004.

The first tail pulse 238 is substantially the same amplitude as the echo pulse from an attenuator-isolated charged line TLP pulse of equal height into an open or short load. Thus, reducing the size of the tail 234 may involve reducing the coupling strength (e.g., via an attenuator). In some cases, however, this may also be accomplished by the use of a well-timed negative step function, or overshoot.

For example, if the step function input 242 to the coupler is altered so that a brief overshoot 246 occurs, with a step down 250 in voltage after one time step (e.g., the round trip time of flight of the coupled charge line section), the voltage in the succeeding time steps can be substantially canceled.

A step down 250 of $\rho^2 V$ after one time step, where V=the amplitude of the initial step, produces its own negative voltage series over an infinite number of time steps, substantially canceling the rest of the positive voltage series (e.g., the tail 234) produced by the initial step. Using the principle of a timed overshoot 246, the coupler response may then comprise substantially a single square pulse 254, lasting about a single time step. For the purposes of this document, rise and fall times of the voltage into the coupler are presumed to be short compared with the electrical length of the coupler.

Therefore, the overshoot principle illustrated in FIG. 2B may be used to provide a single pulse 254, shown in FIG. 2A, that has substantially no tail, or echo. This can be accomplished by adding a tuning stub 122, perhaps in conjunction with a matching component 126, such as a resistor or transistor, at the front end of the charge line 118, shown in FIG. 1. The electrical length of the tuning stub 122 should match that of the directional coupler 114 so as to lower the driving line impedance momentarily, resulting in the desired overshoot. The overshoot may then come to an end after the wave propagating into the tuning stub 122 is reflected and returns to the junction of the tuning stub 122 and the charge line 118, whereupon the matching component 126 and the main line impedances (e.g., 50 ohms each way) substantially match the tuning stub impedance. For example, in the apparatus 100 shown in FIG. 1, if a 2.4 db directional coupler 114 is used, the tuning stub 122 impedance of about 46.75 ohms plus matching component 126 resistance of about 21.75 ohms, combined with a 50-ohm charge line 118, can work well to provide a short, square coupled pulse similar to the pulse 254 of FIG. 2A.

In computer simulations of the apparatus 100, where the resulting pulse 254 (see FIG. 2A) was compared with the step function response 230 (see FIG. 2A) for a 2.4 db coupler (2.4 db at mid-band is commonly specified by manufacturers of directional couplers so that 3 db or better is achieved over an entire octave), the pulse tail 234 extending into the second time step and beyond was found to be 112 db down from the main pulse 254. Using a tuning stub as described herein provides a lower overall system impedance, with the result that the initial pulse 254 magnitude is 0.58V per traveling wave volt, instead of just $\rho$=0.46. This means that a 2.4 db coupler may be used in the apparatus 100 to provide a coupled pulse height just −4.71 db down from the initial pulse into the coupler.

Figure 3:
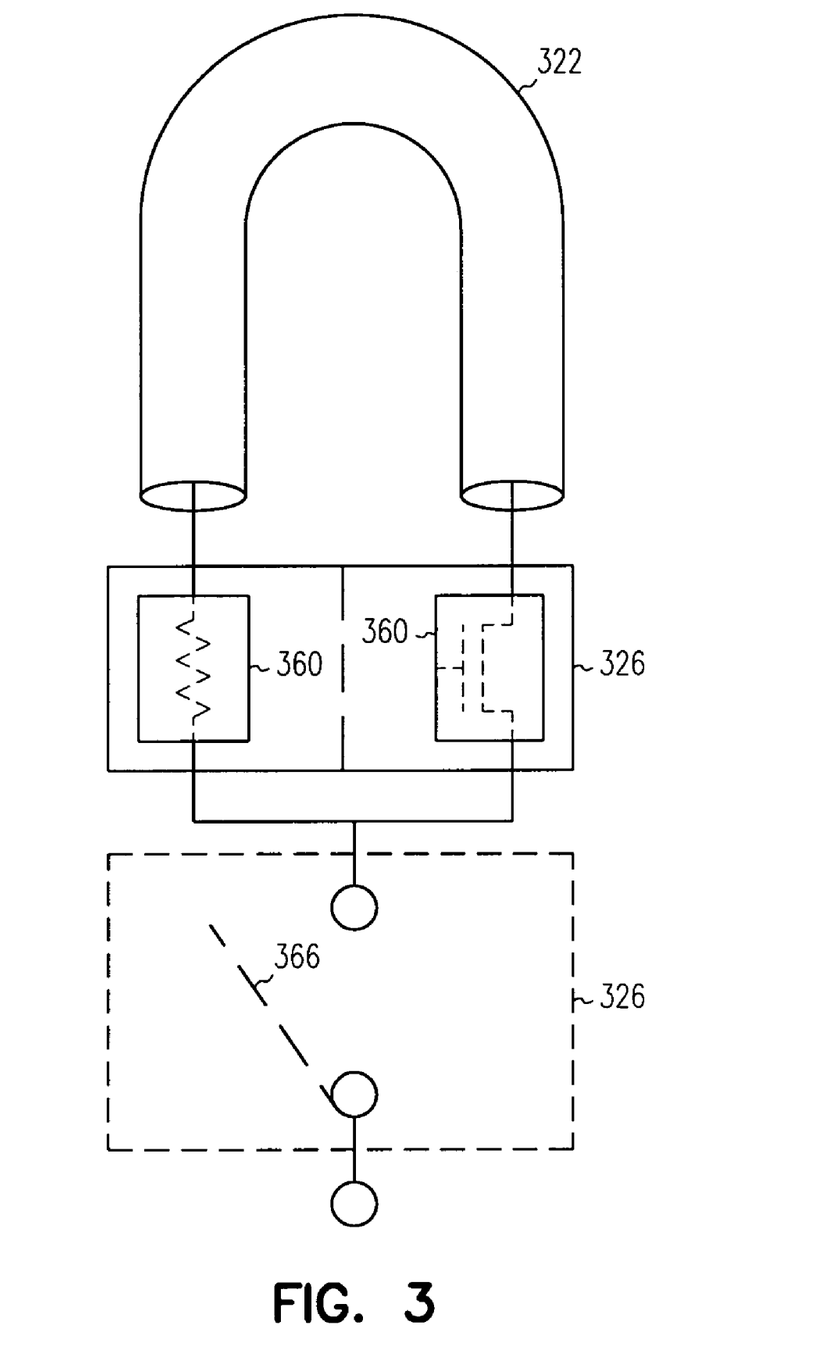
FIG. 3 illustrates a loop stub coupled to a matching element according to various embodiments of the invention.

FIG. 3 illustrates a loop stub 322 coupled to a matching element 326 according to various embodiments of the invention. With a loop stub 322, one can achieve performance substantially equivalent to an open-ended stub 122 (see FIG. 1), perhaps using readily available transmission lines (e.g., 100 ohm twisted pairs). In this case, the waves traveling on the stub 322 may propagate back through the loop, and through each other to the other side, being fairly well impedance-matched by a series resistor (e.g., the matching component 326, which may comprise one or more sub-components 360, such as resistors, transistors, switches, etc.) and 50-ohm charge lines. For example, in the case of a 50 ohm charge line step generator, the impedance of the loop stub 322 might be 100 ohms, with a 75 ohm resistor used in place of each one of the sub-components 360. This set of component values may serve to match to a directional coupler of about 3 db with half the electrical length of the loop stub 322.

Referring back to FIG. 1, it should be noted that using a tuning stub 122 in this manner may result in a less than an ideal impedance match. That is, when the pulse out of the directional coupler 114 reaches a device under test 164 (e.g., perhaps a perfectly reflecting short or open circuit), the reflected pulse may no longer substantially disappear into the matched sources and loads of the apparatus 100, and there may be an unwanted echo pulse provided by the tuned stub 122.

To better understand the following discussion, it should be noted that "3 db" directional couplers, usually refer to a device that is rated at 3 db or better coupling over an octave, which is about 2.4 db at mid-band, or k=0.759. The echo pulse at these levels of coupling is still sufficiently weak, and actually balanced around zero, but reaches the usual limit of a 6 db (e.g., two times) attenuator if measured by the peak-to-peak amplitude. It is possible to further increase the strength of device test pulses by using stronger couplers, perhaps to the theoretical limit of $\rho$=0.577 and, in conjunction with a tuning stub, the ultimate output of the coupler may reach about 0.43 V/volt of the line charge voltage, or a 73% improvement over the best 6 db attenuator pulse (0.25V/volt).

In this case, however, the amplitude of the echo pulse using the mechanisms disclosed to this point may become too large even with a well-designed tuning stub. A solution may reside in the fact that the electrical length of the device under test may be dominated by dispersion (i.e., quality of the transmission lines), so that several nanoseconds are available to accomplish a switching function. Thus, it may be possible for the tuned stub to be turned on (e.g., connected to the coupler) for its voltage-generating function, and turned off (e.g., disconnected from the coupler) in time to prevent reception of the reflected pulse from the device under test.

In some embodiments, the resistive portion of the matching component 126 may be realized with a high-voltage power MOSFET in the ON condition. If the FET breakdown voltage after turnoff is high enough to withstand the echo pulse, the FET can be used to isolate the tuning stub from the echo pulse and thus preserve the impedance-matched source 168.

The MOSFET need not be very large in order to have an ON resistance, with reasonable gate voltage tolerance, of several ohms. Smaller MOSFETs imply low source-drain capacitance, and therefore weak coupling of the echo pulse to the tuning stub 122, as desired. Thus, silicon MOSFETS and silicon-carbide depletion-mode MOSFETs may be useful in forming a portion of the matching component 126 of some embodiments.

To trigger the OFF gate voltage for a transistor (e.g., FET) that may be used as part of the matching component 126, a drop in the 50 ohm line voltage when the pulse is initiated can be detected with a high-impedance circuit fabricated so as to leave the impedance match substantially undisturbed. For example, a change in the voltage-to-ground amplitude might be sensed in conjunction with readily available, inexpensive high-voltage capacitors.

Many embodiments may therefore be realized. For example, in some embodiments of the apparatus 100, the tuning stub 122 may comprise an open-ended stub, a loop stub, or both. The matching component 126 may include one or more transistors, resistors, or both. The matching component 126 may also include an isolation switch to couple and decouple the tuning stub 122 from the charge line 118 (e.g., see the optional switch 366 shown in FIG. 3). As noted previously, a gated transistor (e.g., a FET) may be used for this purpose. The charge line and tuning stub may be fabricated in a number of ways. For example, they may comprise coaxial cables, strip lines, or both.

In many embodiments, the tuning stub 122 may be characterized by an impedance Zx of approximately the line impedance Zs associated with the charge line 118 plus a resistance Rs, such that the resistance Rs plus half of a system impedance Zl associated with the directional coupler 114 is approximately equal to the line impedance Zs. In some embodiments, the matching component 126 may comprise the resistance Rs. In many embodiments, the electrical length (i.e., propagation delay) of the tuning stub 122 may be approximately equal to the electrical length of the directional coupler 114.

The apparatus 100 may also include a switch 172 (e.g., a high-pressure gas relay switch) to initiate release of the charge built up in the charge line 118 and the tuning stub 122 as a pulse into the directional coupler 114. The switch 172 may form an arc as the contacts close and open. Experimentation has shown that the arc may comprise resistance (because its plasma can dissipate power) and that the arc may have its own current-voltage-time behavior. Since the arc may be placed in series with the charge line 118, it can be considered as part of the apparatus 100 for the forward and reflected waves, especially when attempts are made to match the source 168 impedance. For example, if the switch 172 comprises an Aleph ZH1A05NZ mercury coaxial radio frequency (RF) relay, there may be about 10 ohms of switch arc resistance. If the switch 172 comprises a Tohtsu CX-230 single-pole, double-throw (SPDT) coaxial switch, the arc resistance may be about 16 ohms.

Other embodiments may be realized. For example, a system 110 may include one or more apparatus 100, previously described, as well as a circuit board 176 attached to the charge line 118, the tuning stub 122, and the matching component 126.

In some embodiments, the system 110 may include a pulse source 168 to provide an initial charge to the charge line 122 and the tuning stub 122. The pulse source 168 can be implemented in a number of ways, including via a commercially-supplied pulse source, such as the Barth Electronics Model 632 Picosecond Pulse Generator. A commercial impulse noise simulator, similar to or identical to those available from Noise Laboratory Company, Ltd. (i.e., NoiseKen), such as the Model INS-4001, which includes charged transmission lines, can be used for the pulse source 168. The pulse source 168 may be a high voltage source, defined herein to mean a source of greater than about 100 volts of potential difference. Wherever a high voltage source is noted herein, a very high voltage source may also be substituted. As defined herein, a very high voltage source is a source of greater than about 500 volts of potential difference.

In some embodiments, the system 110 may include a display 180 to display the initial pulse from the tuning stub 122 and charge line 118 as it is transmitted to the directional coupler 114. The display 180 may also be used to display pulses received by a device under test 164 from the directional coupler 114, and may comprise any number of types, including a flat panel display, a cathode-ray tube, and an oscilloscope, among others. Thus, the system 110 may also comprise a device under test 164 to couple to the directional coupler 114. The device under test 164 may include any number of items, such as a transmission line, or a circuit, such as an integrated circuit.

The apparatus 100; systems 110; directional coupler 114; charge line 118; tuning stub 122; matching components 126, 326; device under test 164; source 168; switches 172, 366; circuit 176; display 180; loop stub 322; and sub-components 360 may all be characterized as "modules" herein. Such modules may include hardware circuitry, single and/or multi-processor circuits, memory circuits, software program modules and objects, and/or firmware, and combinations thereof, as desired by the architect of the apparatus 100 and systems 110, and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to simulate the operation of various potential embodiments.

It should also be understood that the apparatus and systems of various embodiments can be used in applications other than TLP testing systems, and thus, various embodiments are not to be so limited. The illustrations of apparatus 100 and systems 110 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, single and/or multi-processor modules, single and/or multiple embedded processors, data switches, and application-specific modules, including multilayer, multi-chip modules. Such apparatus and systems may further be included as sub-components within a variety of electronic systems, such as oscilloscopes, test systems, test stations, personal computers, workstations, and others.

Figure 4:
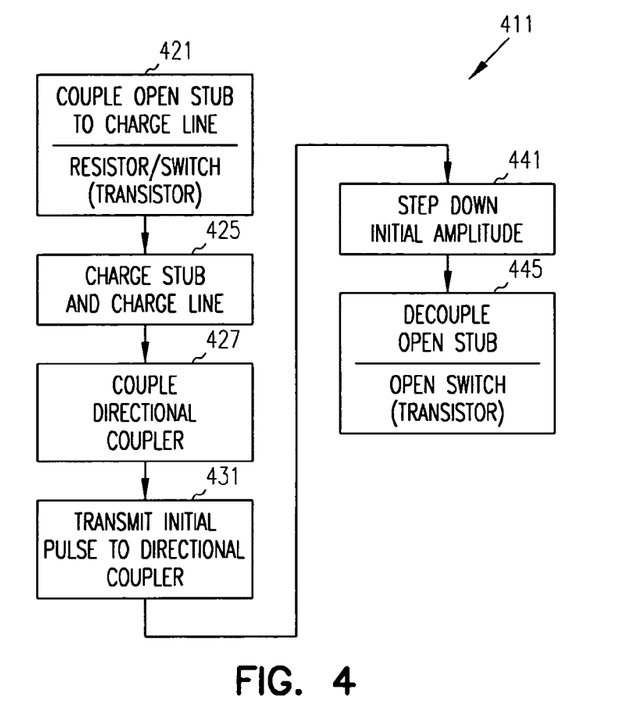
FIG. 4 is a flow diagram illustrating several methods according to various embodiments of the invention.

Some embodiments may include a number of methods. For example, FIG. 4 is a flow diagram illustrating several methods 411 according to various embodiments of the invention. A method 411 may begin at block 421 with coupling a tuning stub to a charge line (e.g., using one or more of a resistor, switch, and/or transistor), charging the charge line and the tuning stub at block 425, and coupling the directional coupler to the charge line (and perhaps the tuning stub) to receive the initial pulse at block 427. The tuning stub may be coupled to the directional coupler in series with a matching component, perhaps selected from a resistor, a transistor, a switch, or some combination of these.

The method 411 may continue with transmitting an initial pulse to the directional coupler at block 431, wherein the initial pulse has an initial amplitude and a timed overshoot of a selected duration. The method may include, at block 441, stepping down the initial amplitude to a subsequent amplitude of approximately the initial amplitude times the mode reflection coefficient squared (e.g., $\rho^2 V$) at about the end of the selected duration. The mode reflection coefficient (e.g., $\rho$) may be about equal to $$\frac{k}{1+\sqrt{1-k^2}},$$

wherein k comprises a ratio of the difference of even and odd mode impedances to the sum of the even and odd mode impedances.

The method 411 may include decoupling the tuning stub from the directional coupler to refrain from receiving an echo pulse associated with the initial pulse, at block 445. For example, this activity may include isolating the tuning stub from an echo pulse associated with the initial pulse by opening a switch coupled in series with the tuning stub. Switching may be accomplished using one or more transistors, as discussed previously, such that one or more transistors may be used as a switch to couple the tuning stub to the charge line, and to decouple the tuning stub from the directional coupler.

It should be noted that the methods described herein do not have to be executed in the order described, or in any particular order. Moreover, various activities described with respect to the methods identified herein can be executed in repetitive, simultaneous, serial, or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using a number of mechanisms well known to those skilled in the art, such as application program interfaces or interprocess communication techniques, including remote procedure calls. The teachings of various embodiments are not limited to any particular programming language or environment.

Figure 5:
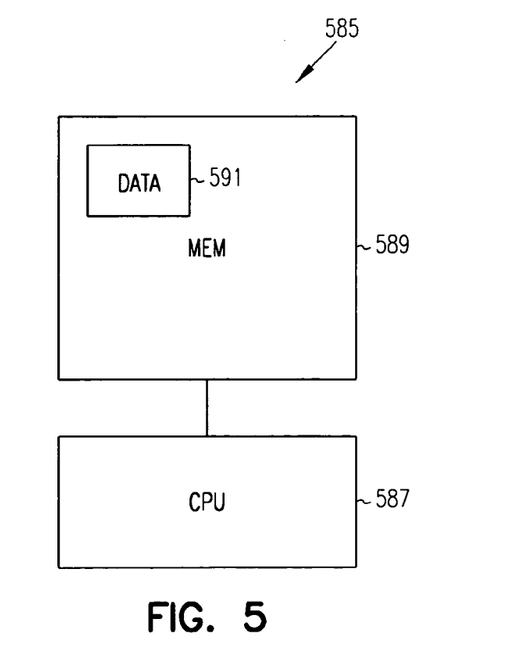
FIG. 5 is a block diagram of an article according to various embodiments of the invention.

Thus, other embodiments may be realized. For example, FIG. 5 is a block diagram of an article 585 according to various embodiments of the invention. Examples of such embodiments may comprise a computer, a memory system, a magnetic or optical disk, some other storage device, and/or any type of electronic device or system. The article 585 may include one or more processors 587 coupled to a machine-accessible medium such as a memory 589 (e.g., a memory including an electrical, optical, or electromagnetic conductor) having associated information 591 (e.g., computer program instructions and/or data stored therein), which, when accessed, results in a machine (e.g., the processor(s) 587) performing such actions as transmitting an initial pulse to a directional coupler (e.g., the initial pulse having an initial amplitude and a timed overshoot of a selected duration), and stepping down the initial amplitude to a subsequent amplitude of approximately the initial amplitude times a mode reflection coefficient squared at about the end of the selected duration.

Additional actions may include coupling a tuning stub to a charge line, charging the charge line and the tuning stub, and coupling the directional coupler to the charge line (and the tuning stub) to receive the initial pulse. Further actions may include decoupling the tuning stub from the directional coupler to refrain from receiving an echo pulse associated with the initial pulse, as well as using one or more transistors as a switch to couple the tuning stub to the charge line, and to decouple the tuning stub from the directional coupler.

Implementing the apparatus, systems, and methods disclosed herein may operate to provide short, impedance matched pulses that reduce the initial pulse into the coupler less than when an attenuator is used, while providing better reduction of echo pulses from unmatched loads. Deriving stronger pulses from a lower charging voltage may permit the use of lower voltage (and less costly) switches used to transmit the initial pulse to the coupler.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may occur directly, or by way of an indirect electrical connection via other devices and connections.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, including:
   a charge line to store a high-voltage charge;
   a switch coupled to the charge line to discharge the charge line to create a high-voltage input pulse;
   a directional coupler coupled to the switch to shape a leading edge of the high-voltage input pulse to create a substantially rectangular high-voltage output pulse for presentation to a device under test (DUT); and
   a tuning stub in a series combination with a matching component, the series combination coupled to a junction of the charge line and the switch to momentarily lower an impedance of the junction as the high-voltage input pulse propagates into the tuning stub and to create a timed over-shoot of a waveform associated with the high-voltage input pulse.

2. The apparatus of claim 1, wherein the tuning stub comprises one of an open-ended stub or a loop stub.

3. The apparatus of claim 1, wherein the matching component includes at least one of a transistor or a resistor.

4. The apparatus of claim 1, wherein the tuning stub is characterized by an impedance Zx of approximately a line impedance Zs associated with the charge line plus a resistance Rs such that the resistance Rs plus half of a system impedance Zl associated with the directional coupler is approximately equal to the line impedance Zs.

5. The apparatus of claim 4, wherein the matching component comprises the resistance Rs.

6. The apparatus of claim 1, wherein the charge line includes at least one of a coaxial cable or a strip line.

7. The apparatus of claim 1, wherein the electrical length of the tuning stub is approximately equal to the electrical length of the directional coupler.

8. The apparatus of claim 1, wherein the tuning stub includes at least one of a coaxial cable or a strip line.

9. The apparatus of claim 1, wherein the matching component includes an isolation switch to decouple the tuning stub from the charge line.

10. A system, including:
    a charge line to store a high-voltage charge;
    a switch coupled to the charge line to discharge the charge line to create a high-voltage input pulse;
    a directional coupler coupled to the switch to shape a leading edge of the high-voltage input pulse to create a substantially rectangular high-voltage output pulse for presentation to a device under test (DUT);
    a tuning stub in a series combination with a matching component, the series combination coupled to a junction of the charge line and the switch to momentarily lower an impedance of the junction as the high-voltage input pulse propagates into the tuning stub and to create a timed over-shoot of a waveform associated with the high-voltage input pulse; and
    a circuit board attached to the charge line, to the tuning stub, and to the matching component.

11. The system of claim 10, further including:
    a pulse source to provide an initial charge to the charge line and to the tuning stub.

12. The system of claim 10, further including:
    a display to display a pulse received from the directional coupler.

13. The system of claim 10, wherein the DUT comprises an integrated circuit.

14. The system of claim 10, wherein the matching component includes at least one of a transistor or a resistor.

15. A method, including:
    transmitting an initial pulse to a directional coupler to create a substantially rectangular high-voltage output pulse, the initial pulse having an initial amplitude and a timed overshoot of a selected duration; and
    stepping down the initial amplitude to a subsequent amplitude of approximately the initial amplitude times a mode reflection coefficient squared at about the end of the selected duration using a tuning stub in a series combination with a matching component.

16. The method of claim 15, further including:
    charging a charge line and the tuning stub, wherein the charge line and the tuning stub are capable of being coupled to the directional coupler using a first switch.

17. The method of claim 15, further including:
    charging a charge line and the tuning stub, the tuning stub in a series combination with a matching component comprising at least one of a resistor or a transistor, wherein the charge line and the series combination are capable of being coupled to the directional coupler using a first switch.

18. The method of claim 15, further including:
    isolating the tuning stub from an echo pulse associated with a reflection of the initial pulse from a device under test (DUT) by opening a second switch coupled in series with the tuning stub.

19. The method of claim 15, wherein the mode reflection coefficient is equal to $$\frac{k}{1+\sqrt{1-k^2}},$$

and wherein k comprises a ratio of a difference of even and odd mode impedances to a sum of the even and odd mode impedances.

20. An article including a machine-accessible medium having associated information, wherein the information, when accessed, results in a machine performing:
    transmitting an initial pulse to a directional coupler to create a substantially rectangular high-voltage output pulse, the initial pulse having an initial amplitude and a timed overshoot of a selected duration; and
    stepping down the initial amplitude to a subsequent amplitude of approximately the initial amplitude times a mode reflection coefficient squared at about the end of the selected duration using a tuning stub in a series combination with a matching component.

21. The article of claim 20, wherein the information, when accessed, results in a machine performing:
    coupling the tuning stub to a charge line;
    charging the charge line and the tuning stub; and
    coupling the directional coupler to the charge line to receive the initial pulse.

22. The article of claim 21, wherein the information, when accessed, results in a machine performing:
    decoupling the tuning stub from the directional coupler to refrain from receiving an echo pulse associated with a reflection of the initial pulse from a device under test (DUT).

23. The article of claim 22, wherein the information, when accessed, results in a machine performing:
    using at least one transistor as a switch to couple the tuning stub to the charge line and to decouple the tuning stub from the directional coupler.

* * * * *